United States Patent
Lo et al.

(10) Patent No.: US 8,056,041 B2
(45) Date of Patent: Nov. 8, 2011

(54) APPARATUS AND METHOD OF PREVENTING CONGESTIVE PLACEMENT

(75) Inventors: Chen-Hsing Lo, Hsinchu Hsien (TW);
Chien-Pang Lu, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 290 days.

(21) Appl. No.: 12/471,443

(22) Filed: May 25, 2009

(65) Prior Publication Data

US 2010/0122229 A1 May 13, 2010

(30) Foreign Application Priority Data

Nov. 13, 2008 (TW) .............................. 97143871 A (51) Int. Cl.
*G06F 17/50* (2006.01)

(52) U.S. Cl. ........ 716/122; 716/123; 716/124; 716/129; 716/130

(58) Field of Classification Search .................. 716/122, 716/123, 124, 129, 130
See application file for complete search history.

(56) References Cited

U.S. PATENT DOCUMENTS

| | | | | |
|---|---|---|---|---|
| 4,890,238 | A * | 12/1989 | Klein et al. | 716/124 |
| 5,673,201 | A * | 9/1997 | Malm et al. | 716/129 |
| 6,298,468 | B1 * | 10/2001 | Zhen | 716/122 |
| 7,225,421 | B2 * | 5/2007 | Migatz et al. | 716/114 |
| 7,315,995 | B2 * | 1/2008 | Nishiwaki | 716/112 |
| 7,840,919 | B1 * | 11/2010 | Wang et al. | 716/132 |
| 2001/0003843 | A1 * | 6/2001 | Scepanovic et al. | 716/7 |
| 2003/0115566 | A1 * | 6/2003 | Teig | 716/14 |
| 2003/0217348 | A1 * | 11/2003 | Nonaka | 716/13 |
| 2007/0061769 | A1 * | 3/2007 | Kumagai | 716/13 |
| 2007/0234259 | A1 * | 10/2007 | Drumm et al. | 716/9 |
| 2007/0245280 | A1 * | 10/2007 | Van Eijk et al. | 716/9 |
| 2007/0300193 | A1 * | 12/2007 | Lillis et al. | 716/3 |
| 2008/0250375 | A1 * | 10/2008 | Miller et al. | 716/10 |
| 2010/0023910 | A1 * | 1/2010 | Chen et al. | 716/10 |

* cited by examiner

*Primary Examiner* — Phallaka Kik
(74) *Attorney, Agent, or Firm* — WPAT., P.C.; Justin King (57) ABSTRACT

An apparatus of preventing congestive placement is provided. The apparatus comprises a judging module, a pattern generating module, and a placement module. The judging module judges whether a circuit layout comprises a congestive region according to a judging rule. When a judgment result of the judging module is affirmative, the pattern generating module generates a redistribution pattern with a density distribution of blockages. The density distribution gradually decreases outward. The placement module regards the congestive region as the center redistributes the blockages and electronic cells according to the redistribution pattern.

20 Claims, 9 Drawing Sheets

▧ Minimum-sized non-transparent blockages

APPARATUS AND METHOD OF PREVENTING CONGESTIVE PLACEMENT

CROSS REFERENCE TO RELATED PATENT APPLICATION

This patent application is based on a Taiwan, R.O.C. patent application No. 097143871 filed on Nov. 13, 2008.

FIELD OF THE INVENTION

The present invention relates to a circuit layout, and more particularly, to an apparatus and method of preventing congestive placement in a circuit layout.

BACKGROUND OF THE INVENTION

Accompanied with continual development of the electronic technology, various electronic products are becoming more and more compact and versatile with overwhelmingly diversified functions. Therefore, a large number of electronic components of all types need be provided in a chip having a relatively small area in order to meet actual requirements of the electronic products.

However, in certain circuit layout, it happens that the number of electronic components within a certain area gets too large, that is, a density of the electronic components of the area is too high, such that routing between the electronic components within the area becomes infeasible. The circuit layout not only fails to pass design rule checking but is also unable to function normally.

Figure 1:
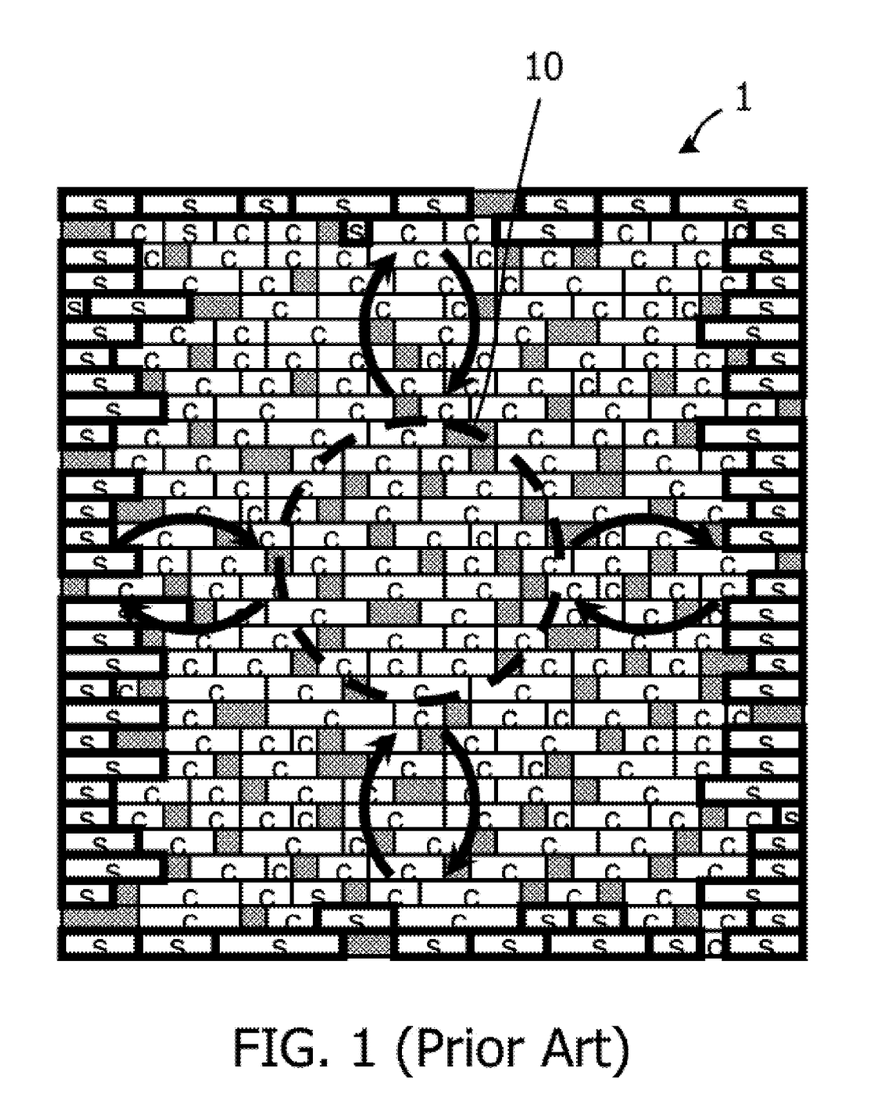
FIG. 1 is a schematic diagram of a circuit layout on a chip with a congestive region.

For example, refer to FIG. 1 showing a plurality of combinational cells (e.g. NAND and OR logic gates) and a plurality of sequential cells (e.g., flip-flops) of a circuit layout on a chip. The combinational cells are represented in c, the sequential cells are represented in s, the arrows indicate data flow directions, and the shaded grids are blockages or spacing between the cells.

In this embodiment, suppose the density of the electronic cells with respect to an overall space 1 is 70%; that is, the electronic cells including the combinations cells c and the sequential cells s occupy 70% of the overall space 1, and the blockages and spacing occupy the remaining 30% of the overall space 1. To have the circuit layout pass time constraint, the combinational cells c are mostly placed at a central area of the overall space 1, while the sequential cells s are mostly placed at outer areas of the overall space 1. As observed, in a congestive region 10, quite a number of combinational cells c are crowded together to result in congestion. As stated, with an excessively high electronic cell density, routing between the electronic cells can become extremely difficult that the circuit layout fails to pass design rule checking.

Therefore, it is one of the objectives to provide an apparatus and method of preventing congestive placement to overcome of aforesaid issues.

SUMMARY OF THE INVENTION

According to a first embodiment of the invention, an apparatus of preventing congestive placement is provided. The congestive placement preventing apparatus is implemented in a circuit layout comprising a plurality of electronic cells and a plurality of blockages. The electronic cells and the blockages are placed in the circuit layout using a predetermined distribution pattern. In this embodiment, the blockages are minimum-sized blockages that do not overlap with the electronic cells.

The congestive placement preventing apparatus comprises a judging module, a pattern generating module and a placement module. The judging module is coupled to the pattern generating module and the circuit layout. The judging module judges whether the circuit layout comprises a congestive region according to a judging rule. When a judgment result of the judging module is affirmative, the pattern generating module generates a redistribution pattern comprising a density distribution of the blockages, wherein the density distribution gradually decreases outward. The placement module regards the congestive region as a center, and redistributes the electronic cells and the blockages according to the redistribution pattern. That is, the placement module redistributes the electronic cells and the blockages according to the redistribution pattern, by centering the congestive region.

It is to be noted that, an empty space ratio between the electronic cells and the blockages remains unchanged even after the redistribution by the placement module. In practice, the judging rule may be associated with whether the density of the electronic cells in the congestive region is too high. When the density of the electronic cells placed in the congestive region gets too high, routing between the electronic cells in the region becomes extremely difficult.

According to a second embodiment of the invention, an apparatus of preventing congestive placement is provided. The congestive placement preventing apparatus is implemented in a circuit layout comprising a plurality of electronic cells and a plurality of blockages. The electronic cells and the blockages are placed in the circuit layout using a predetermined distribution pattern. In this embodiment, the blockages are transparent blockages that partially overlap with the electronic cells.

The congestive placement preventing apparatus comprises a judging module, a pattern generating module and a placement module. The judging module is coupled to the pattern generating module and the circuit layout. The judging module judges whether the circuit layout comprises a congestive region according to a judging rule. When a judgment result of the judging module is affirmative, the pattern generating module generates a redistribution pattern comprising a density distribution of the blockages, wherein the density distribution gradually decreases outward. The placement module regards the congestive region as a center, and redistributes the electronic cells and the blockages according to the redistribution pattern. That is, the placement module redistributes the electronic cells and the blockages according to the redistribution pattern, by centering the congestive region. It is to be noted that, an empty space ratio between the electronic cells and the blockages remains unchanged even after the redistribution by the placement module.

According to a third embodiment of the invention, a method of preventing congestive placement is provided. The congestive placement preventing method is implemented in a circuit layout comprising a plurality of electronic cells and a plurality of blockages. The electronic cells and the blockages are placed in the circuit layout using a predetermined distribution pattern. In this embodiment, the blockages are minimum-sized blockages that do not overlap with the electronic cells.

According to a judging rule, it is judged whether the circuit layout comprises a congestive region. When a judgment result is affirmative, a redistribution pattern is generated. The redistribution pattern comprises a density distribution of the blockages, wherein the density distribution gradually decreases outward. The blockages and the electronic cells are then redistributed according to the redistribution pattern by centering the congestive region.

According to a fourth embodiment of the invention, a method of preventing congestive placement is provided. The congestive placement preventing method is implemented in a circuit layout comprising a plurality of electronic cells and a plurality of blockages. The electronic cells and the blockages are placed in the circuit layout using a predetermined distribution pattern. In this embodiment, the blockages are transparent blockages that partially overlap with the electronic cells.

According to a judging rule, it is judged whether the circuit layout comprises a congestive region. When a judgment result is affirmative, a redistribution pattern is generated. The redistribution pattern comprises a density distribution of the blockages, wherein the density distribution gradually decreases outward. The blockages and the electronic cells are then redistributed according to the redistribution pattern by centering the congestive region.

Conclusive from the foregoing description, the apparatus and method of preventing congestive placement according to the invention, using a simple principle, effectively eliminate a previously congestive region in the circuit layout, whereby issue of the circuit layout failing to pass design rule checking due to routing difficulties between the electronic cells in the congestive region of the circuit layout is solved. In addition, by solving the congestion of the electronic cells in the circuit layout using the apparatus and method of preventing congestive placement according to the invention, not only no undesired side effects such as lowered space utilization or increased chip size is resulted, but routing flexibility between the electronic cells is also expanded.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENT

It is one of the objectives of the invention to provide an apparatus and method of preventing congestive placement. The congestive placement preventing apparatus and method effectively eliminates congestion of electronic cells in a circuit layout to reduce routing difficulties between the electronic cells, thereby facilitating the circuit layout to pass design rule checking while increasing routing flexibility between the electronic cells in a circuit layout design.

According to a first embodiment of the invention, an apparatus of preventing congestive placement is disclosed. In this embodiment, the congestive placement preventing apparatus is implemented in a circuit layout comprising a plurality of electronic cells and a plurality of blockages. The electronic cells and the blockages are placed in the circuit layout using a predetermined distribution pattern.

For example, the plurality of electronic cells may be combinational cells, e.g., NAND and OR, and sequential cells, e.g., flip-flops. The plurality of blockages may be minimum-sized non-transparent blockages. Owing to non-transparency of the minimum-sized blockages, the electronic cells do not overlap with the blockages.

Figure 2:
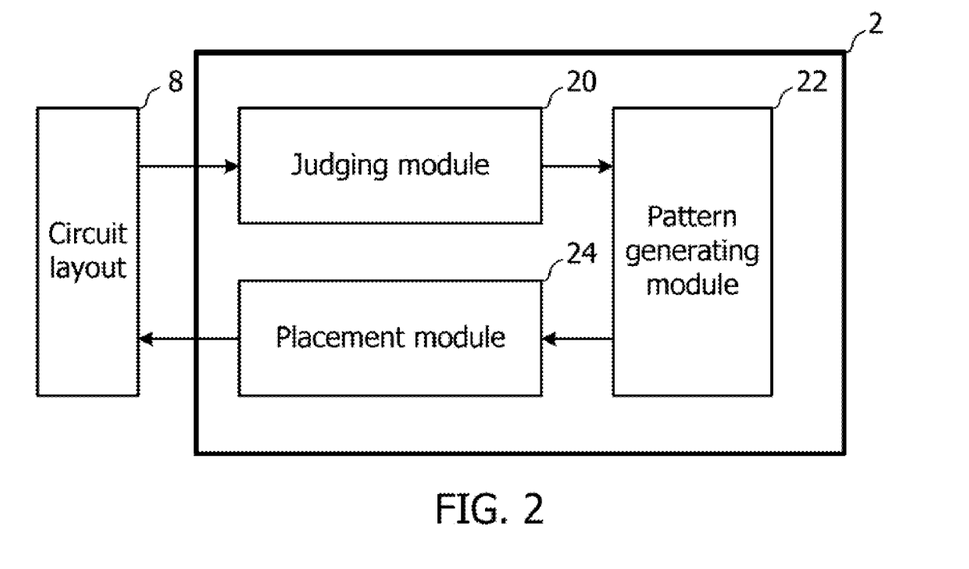
FIG. 2 is a functional block diagram of a congestive placement preventing apparatus according to first and second embodiments of the invention.

FIG. 2 shows a functional block diagram of the congestive placement preventing apparatus. As shown, a congestive placement preventing apparatus 2 comprises a judging module 20, a pattern generating module 22 and a placement module 24. The judging module 20 is coupled to a circuit layout 8 and the pattern generating module 22. The placement module 24 is coupled to the pattern generating module 22 and the circuit layout 8. The various modules of the congestive placement preventing apparatus 2 and functions thereof shall be illustrated below.

The judging module 20 first judges whether the circuit layout 8 comprises a congestive region according to a judging rule. In practice, when a density of electronic cells placed within a certain region gets too high, routing difficulties between the electronic cells within the region may arise. Therefore, the judging rule may be associated with whether the density of the electronic cells within a certain region is too high. When the density of electronic cells within a certain region gets too high, the judging module judges the region as a congestive region.

For example, the judging rule may but not limited to include a density threshold of electronic cells. When the judging module 20 detects that density of electronic cells within a certain region of the circuit layout 8 is higher than the threshold, it means that the electronic cells placed within the region are overcrowded that routing difficulties are likely to arise. The judging module 20 then judges the region as a congestive region. On the contrary, when a judgment result of the judging module 20 indicates that the density of the electronic cells within the region is not higher than the threshold, it means that the electronic cells placed within the region are not yet considered as overcrowded; that is, routing complications between the various electronic cells are within an acceptable range. Thus, the judging module 20 judges that the region is not a congestive region.

When the judgment result of the judging module 20 is affirmative, it means the region is a congestive region, and the pattern generating module 22 generates a redistribution pattern. In this embodiment, the redistribution pattern may comprise a density distribution of the plurality of blockages. The invention is aimed to redistribute previously crowded electronic cells at a central area to outer areas, and therefore the blockages are to be distributed in an opposite manner. More specifically, the density distribution of the blockages decreases outward.

In practice, the density distribution of the blockages may be a random distribution, such as but not limited to, a density distribution of the blockages generated by a Monte Carlo method. Apart from being pre-programmed by a system, settings for the density distribution of the blockages may also be, but not limited to, user-specified.

Figure 3:
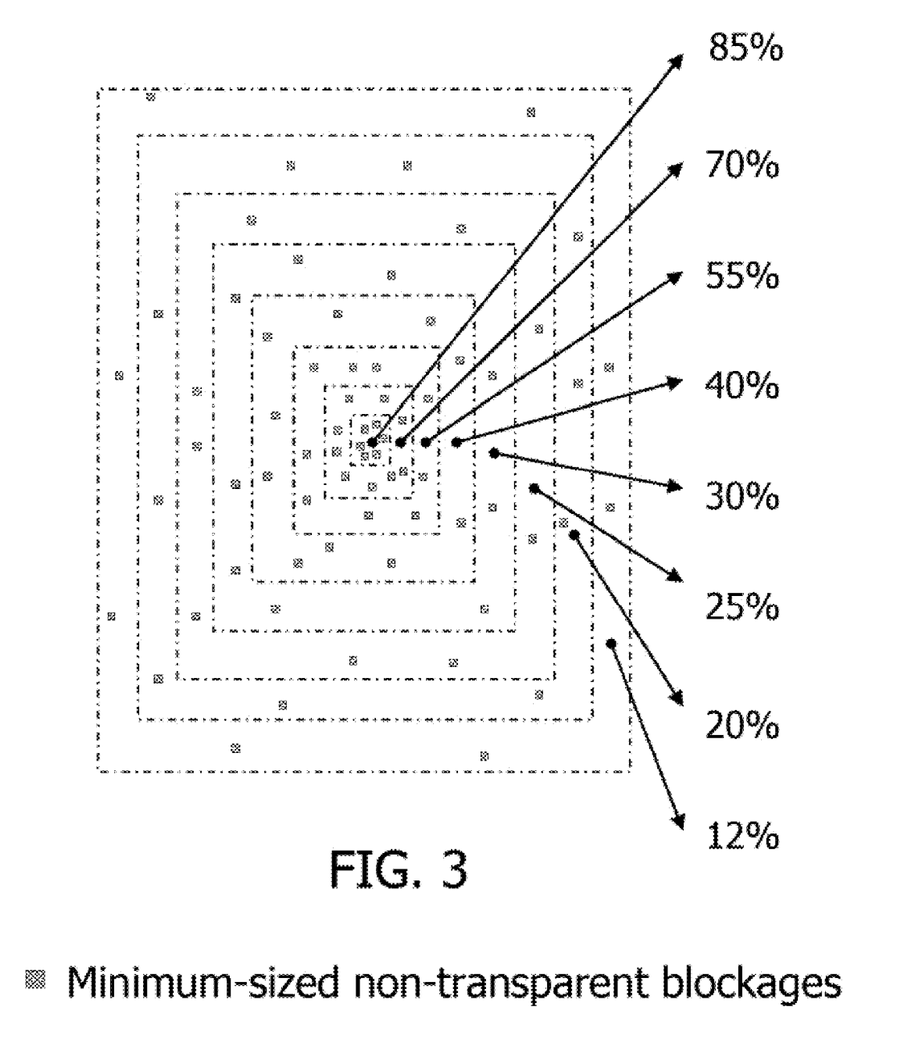
FIG. 3 is a diagram showing a density distribution of blockages in one example.

FIG. 3 shows an example of a density distribution of the blockages. As shown, shaded grids represent the blockages, as minimum-sized blockages in this embodiment. From an innermost frame to an outermost frame, densities of the blockages are 85%, 70%, 55%, 40%, 30%, 25%, 20%, and 12%, respectively; that is, the density distribution of the blockages gradually decrease outward. The foregoing density values are only examples that are not meant to limit the scope of the invention, and actual values may vary according to characteristics of electronic cells in a circuit layout. Further, in addition to such concentric type that gradually decreases outward, the density distribution may also decrease from one point toward one direction, or may be but not limited to other forms.

Taking the innermost frame for example, the blockages in this frame occupy 85% of the area of the frame, meaning that there is 15% available space for placing electronic cells. In contrast, taking the outermost frame for example, the blockages in this frame merely occupy 12% of the area of the frame, meaning that there is 88% available space for placing electronic cells. Whereby, the density distribution of blockages gradually decreasing outward effectively eliminates the previous congestion of the electronic cells at the central area.

Figure 4:
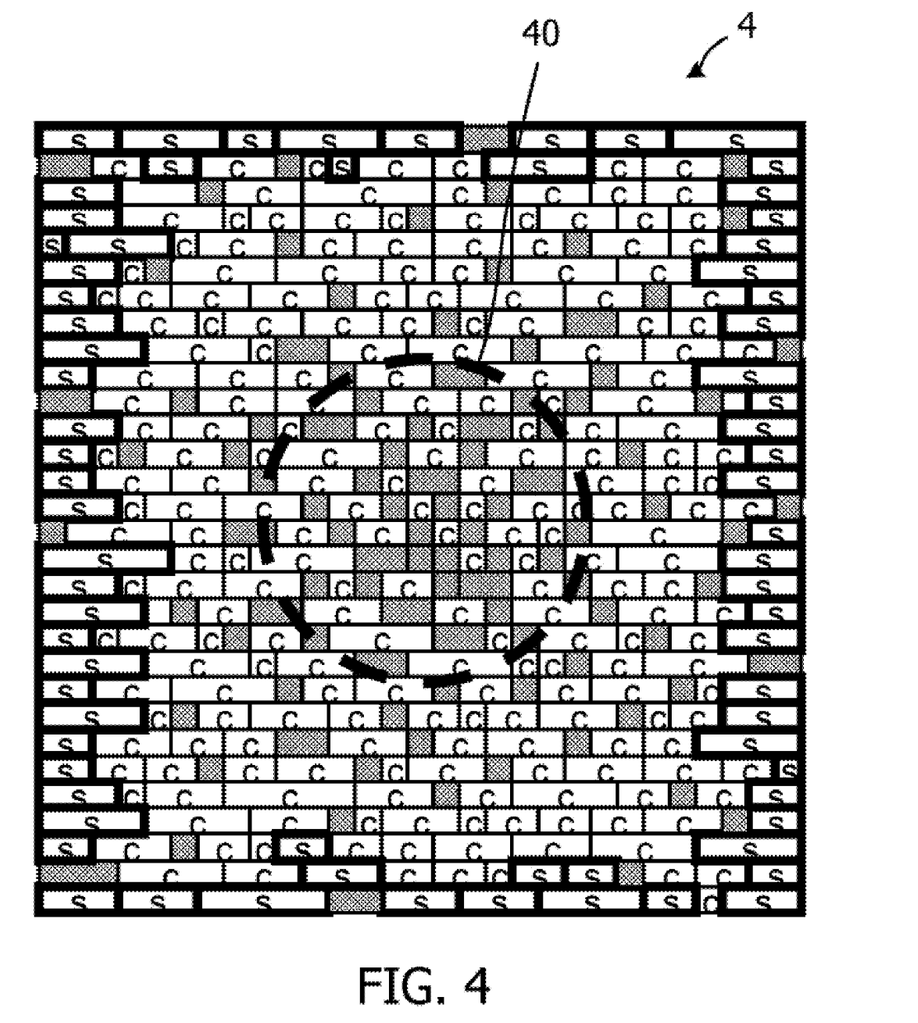
FIG. 4 is a diagram showing the electronic cells in FIG. 1 having been redistributed according to the blockages in FIG. 3.

When the redistribution pattern is generated by the pattern generating module 22, the placement module 24 regards the congestive region as a center and redistributes the blockages and the electronic cells according to the redistribution pattern. That is, the placement module 24 redistributes the blockages and the electronic cells according to the redistribution pattern by centering the congestive region. For example, a distribution shown in FIG. 4 is obtained by implementing the redistribution using the density distribution of the blockages in FIG. 3 to the circuit layout on the chip in FIG. 1. Observed from FIG. 4, the number of sequential cells c in a region 40 in FIG. 4 is less than that in the congestive region 10 in FIG. 1; that is, a density of the sequential cells c in the region 40 is far smaller than that of the sequential cells c in the congestive region 10. Therefore, routing difficulties that are likely to occur between the electronic cells in the congestive region 10 are effectively eliminated in the region 4.

It is to be noted that, an empty space ratio of the electronic cells and the blockages after the redistribution by the distributing module 24 is substantially the same as that before the redistribution. Refer to FIG. 1 and FIG. 4 for example. In FIG. 1, densities of the electronic cells and the blockages are 70% and 30% of the overall space 1, respectively. After the redistribution, densities of the electronic cells and the blockages are still 70% and 30% of the overall space 4, respectively. More specifically, an empty space ratio of the electronic cells and the blockages after the redistribution is substantially the same as that before the redistribution. The congestive placement preventing apparatus 2 according to the invention does not result in any undesirable side-effects in space utilization of the electronic cells in the chip, and therefore congestion is prevented without having to enlarge an area of the chip as an advantage of the present invention.

According to a second embodiment of the invention, an apparatus of preventing congestive placement is disclosed. Similarly, the congestive placement preventing apparatus is implemented in a circuit layout comprising a plurality of electronic cells and a plurality of blockages. The electronic cells and the blockages are placed in the circuit layout using a predetermined distribution pattern. For example, the plurality of electronic cells may be combinational cells, e.g., NAND and OR, and sequential cells, e.g., flip-flops.

In this embodiment, a congestive placement preventing apparatus comprises a judging module, a pattern generating module and a placement module. The judging module is coupled to the circuit layout and the pattern generating module. The placement module is coupled to the pattern generating module and the circuit layout. The judging module judges whether the circuit layout comprises a congestive region according to a judging rule. When a judgment result of the judging module is affirmative, it means a certain region on the circuit layout is congestive with overcrowded electronic cells placed, and the pattern generating module generates a redistribution pattern. The redistribution pattern comprises a density distribution of the plurality of blockages, and the density distribution of the blockages decreases outward. The placement module, by centering the congestive region, redistributes the blockages and the electronic cells according to the redistribution pattern. Refer to FIG. 2 for a functional block diagram of the congestive placement preventing apparatus according to this embodiment of the invention.

One major difference between this embodiment and the first embodiment is that, the blockages in this embodiment are transparent blockages that may overlap with the electronic cells. More specifically, the transparent blockages allow partial electronic cells to be placed thereon, which is distinct from the non-transparent blockages that do not overlap with any of the electronic cells as described in the first embodiment.

Figure 5:
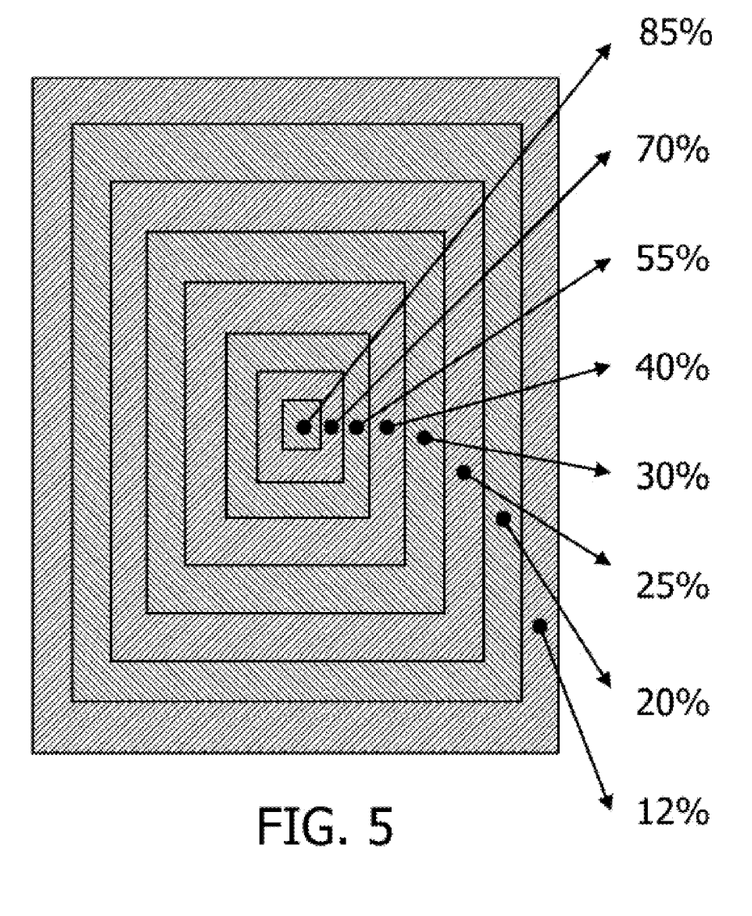
FIG. 5 is a diagram showing a density distribution of blockages in one example.

FIG. 5 shows an example of a density distribution of the blockages. In this embodiment, the blockages are transparent blockages represented by frames in FIG. 5. From an innermost frame to an outermost frame, densities of the blockages are 85%, 70%, 55%, 40%, 30%, 25%, 20%, and 12%, respectively; that is, the density distribution of the blockages gradually decrease outward. The foregoing density values are only examples that are not meant to limit the scope of the invention, and actual values may vary according to characteristics of electronic cells in a circuit layout.

Taking the innermost transparent blockage region for example, the density of the blockages is 85%; that is, the blockages in this transparent blockage region randomly occupy 85% of the area of the region, meaning that there is 15% available space for placing electronic cells. In contrast, taking the outermost transparent blockage region with for example, the blockages in this transparent blockage region merely occupy 12% of the area of the region, meaning that there is 88% available space for placing electronic cells. Whereby, the density distribution of blockages gradually decreasing outward effectively eliminates the previous congestion of the electronic cells at the central area.

Figure 6A:
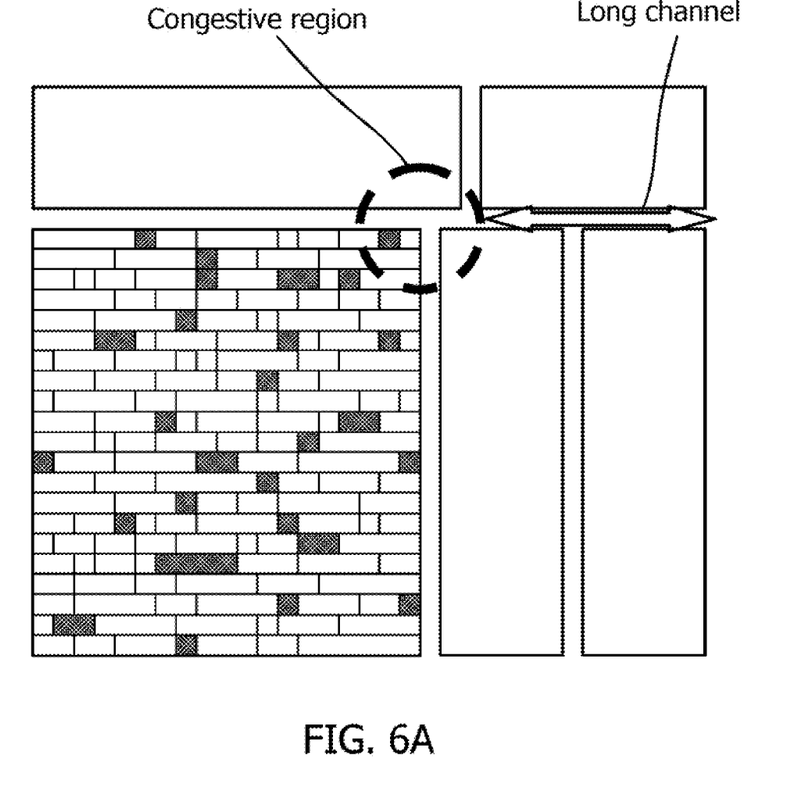
FIG. 6A is a schematic diagram of congestion of electronic cells due to long-channel effects.
Figure 6B:
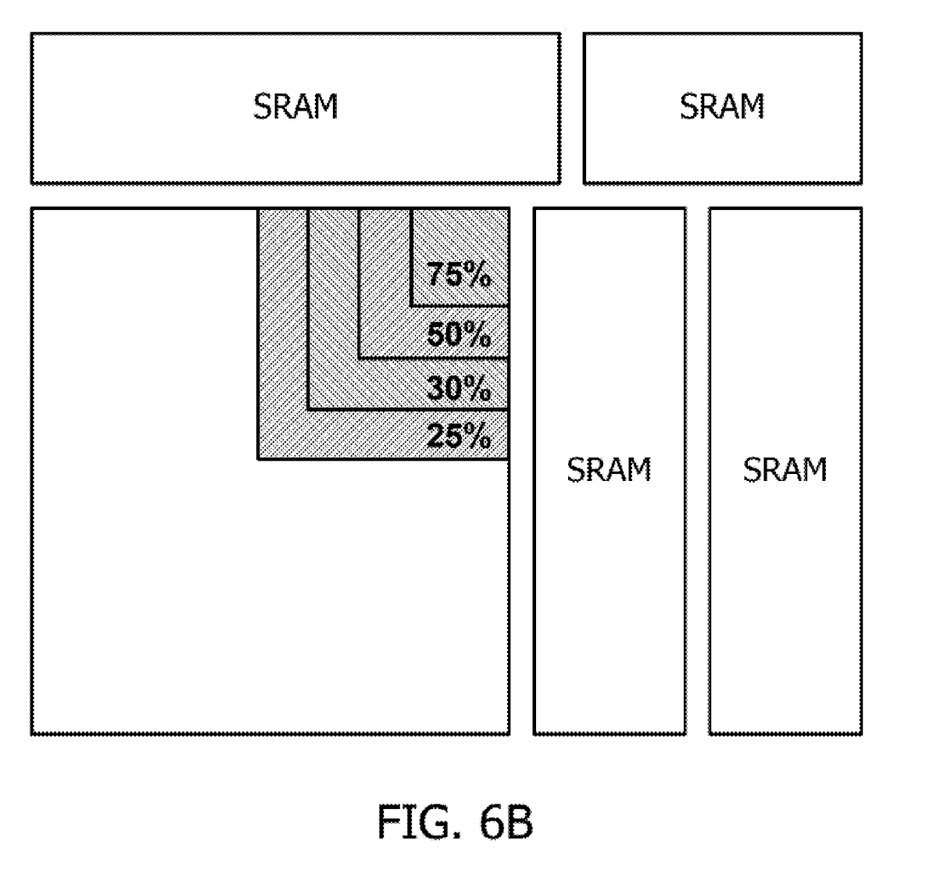
FIG. 6B is a diagram showing a density distribution of blockages in one example.

Further, in addition to the common concentric type that gradually decreases outward, the density distribution may but not limited to decrease from one point to one direction as shown in FIG. 6B, wherein the density distribution of the blockages gradually decreases from a point at the top right to the bottom left.

Figure 6C:
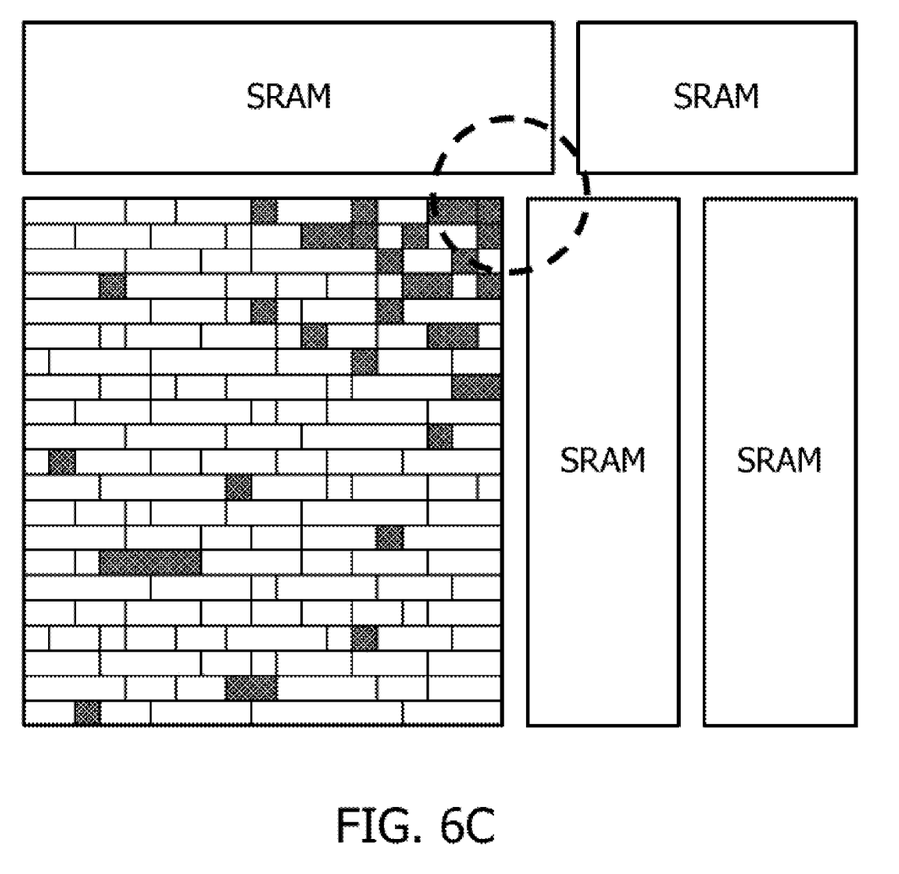
FIG. 6C is a diagram showing the electronic cells in FIG. 6A having been redistributed according to the blockages in FIG. 6B.

FIG. 6A shows a schematic diagram of congestion of electronic cells due to long-channel effects. As shown, a narrow, long channel of various memories such as SRAM or other types significantly increase routing difficulties between the electronic cells at the narrow, long channel. To solve such issue, the density distribution of blockages shown in FIG. 6B is implemented to obtain a distribution result as shown in FIG. 6C, in which the density of the electronic cells in the congestive region is lowered. After redistribution, the density of the electronic cells within the dotted circuit is effectively lowered to facilitate routing between the electronic cells.

According to a third embodiment of the invention, a method of preventing congestive placement is disclosed. In this embodiment, the congestive placement preventing method is implemented in a circuit layout comprising a plurality of electronic cells and a plurality of blockages. The electronic cells and the blockages are placed in the circuit layout using a predetermined distribution pattern.

For example, the plurality of electronic cells may be combinational cells, e.g., NAND and OR, and sequential cells, e.g., flip-flops. The plurality of blockages may be minimum-sized non-transparent blockages. Owing to non-transparency of the minimum-sized blockages, the electronic cells do not overlap with the blockages.

Figure 7:
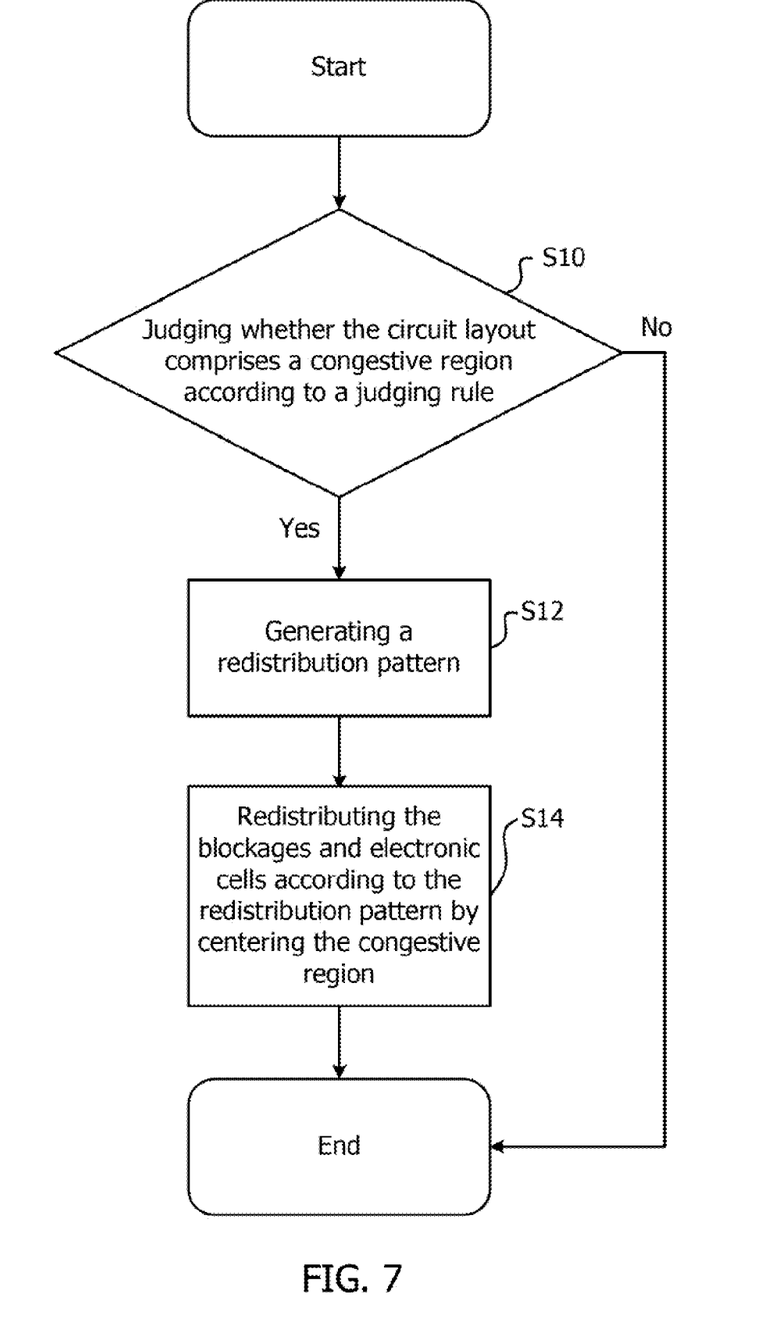
FIG. 7 is a flowchart of a method of preventing congestive placement according to third and fourth embodiments of the invention.

FIG. 7 shows a flowchart of the congestive placement preventing method. In starting Step S10 of the method, the circuit layout is judged for whether it comprises a congestive region according to a judging rule. In practice, the judging rule may be associated with whether the density of the electronic cells in the congestive region is too high. When the density of the electronic cells placed in the congestive region gets too high, routing between the electronic cells in the region becomes highly difficult. For example, when the density of electronic cells within a certain region gets too high, Step S10 of the method judges the region as a congestive region.

When a judgment result of Step S10 is negative, the method is terminated. When a judgment result of Step S10 is affirmative, Step S12 is performed to generate a redistribution pattern. The redistribution pattern, comprising a density distribution of the plurality of blockages, gradually decreases outward.

In this embodiment, the redistribution pattern may comprise a density distribution of the plurality of blockages. The invention is aimed to redistribute previously crowded electronic cells at a central area to outer areas, and therefore the blockages are to be distributed in an opposite manner. More specifically, the density distribution of the blockages decreases outward.

In practice, the density distribution of the blockages may be a random distribution, such as but not limited to, a density distribution of the blockages generated a Monte Carlo method. Apart from being pre-programmed by a system, settings for the density distribution of the blockages may also be but not limited to user-specified.

Upon availability of the redistribution pattern, Step S14 is performed to redistribute the plurality of blockages and the plurality of electronic cells according to the redistribution pattern by centering the congestive region. For example, a distribution shown in FIG. 4 is obtained by implementing the redistribution using the density distribution of the blockages in FIG. 3 to the circuit layout on the chip in FIG. 1. Observed from FIG. 4, the number of sequential cells c in a region 40 in FIG. 4 is less than that in the congestive region 10 in FIG. 1; that is, a density of the sequential cells c in the region 40 is far smaller than that of the sequential cells c in the congestive region 10. Therefore, routing difficulties that are likely to occur between the electronic cells in the congestive region 10 is effectively eliminated in the region 40.

It is to be noted that, an empty space ratio between the electronic cells and the blockages remains unchanged even after the redistribution. More specifically, an empty space ratio of the electronic cells and the blockages after the redistribution is substantially the same as that before the redistribution. The congestive placement preventing method according to the invention does not result in any undesirable side-effects in space utilization of the electronic cells in the chip, and therefore congestion is prevented without having to enlarge an area of the chip as an advantage of the present invention.

According to a fourth embodiment of the invention, a method of preventing congestive placement is disclosed. In this embodiment, the congestive placement preventing method is implemented in a circuit layout comprising a plurality of electronic cells and a plurality of blockages. The electronic cells and the blockages are placed in the circuit layout using a predetermined distribution pattern.

In this embodiment, a circuit layout is judged to whether it comprises a congestive region according to a judging rule. When a judgment result is negative, the method is terminated. When a judgment result is affirmative, a redistribution pattern is generated. The redistribution pattern comprises a density distribution of the plurality of blockages, and the density distribution decreases outward. The plurality of blockages and the plurality of electronic cells are redistributed according to the redistribution pattern by centering the congestive region. Refer to FIG. 7 for the flowchart of the congestive placement preventing method.

One major difference between this embodiment and the third embodiment is that, the blockages in this embodiment are transparent blockages that may overlap with the electronic cells. More specifically, the transparent blockages allow partial electronic cells to be placed thereon, which is distinct from the non-transparent blockages that are non-overlapping with any of the electronic cells as described in the third embodiment. Applications of this embodiment are similar to those described in the second embodiment, and shall be omitted for brevity.

Conclusive from the foregoing description, the apparatus and method of preventing congestive placement according to the invention, using a simple principle, effectively eliminate a previously congestive region in the circuit layout, whereby the issue of the circuit layout failing to pass design rule checking due to routing difficulties between the electronic cells in the congestive region of the circuit layout is solved.

It is to be noted that, by solving congestion of the electronic cells in the circuit layout using the apparatus and method of preventing congestive placement according to the invention, not only no undesired side effects such as lowered space utilization or increased chip size is resulted, but routing flexibility between the electronic cells is also expanded.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for preventing congestive placement, implemented for placement of a circuit layout comprising a plurality of electronic cells and a plurality of blockages, the method comprising steps of:
   generating a redistribution pattern when the circuit layout comprises a congestive region; and
   redistributing, by using a computer, the blockages and the electronic cells according to the redistribution pattern, by centering the congestive region.

2. The method as claimed in claim 1, prior to the generating step, further comprising a step of:
   judging whether the circuit layout comprises the congestive region according to a judging rule.

3. The method as claimed in claim 2, wherein the judging rule is associated with a density of the electronic cells placed within a region.

4. The method as claimed in claim 3, wherein the region is judged as the congestive region when the density of the electronic cells placed within the region exceeds a threshold.

5. The method as claimed in claim 1, wherein the redistribution pattern comprises a density distribution of the blockages.

6. The method as claimed in claim 5, wherein the density distribution gradually decreases outward.

7. The method as claimed in claim 5, wherein the density distribution is generated using a random mode.

8. The method as claimed in claim 1, wherein the blockages are minimum-sized blockages, and the electronic cells are non-overlapping with the blockages.

9. The method as claimed in claim 1, wherein the blockages are transparent blockages, and the electronic cells overlap with the blockages.

10. The method as claimed in claim 1, wherein an empty space ratio after the redistribution is substantially the same as that before the redistribution.

11. An apparatus of preventing congestive placement, implemented in a circuit layout comprising a plurality of electronic cells and a plurality of blockages, the apparatus comprising:
   a pattern generating module, for generating a redistribution pattern when the circuit layout comprises a congestive region; and
   a placement module, coupled to the pattern generating module and the circuit layout, for redistributing the blockages and the electronic cells according to the redistribution pattern by centering the congestive region.

12. The apparatus as claimed in claim 11, further comprising:
   a judging module, coupled to the pattern generating module and the circuit layout, for judging whether the circuit comprises the congestive region according to a judging rule.

13. The apparatus as claimed in claim 12, wherein the judging rule is associated with a density of the electronic cells placed within a region.

14. The apparatus as claimed in claim 13, wherein the region is judged as the congestive region when the density of the electronic cells placed within the region exceeds a threshold.

15. The apparatus as claimed in claim 11, wherein the redistribution pattern comprises a density distribution of the blockages.

16. The apparatus as claimed in claim 15, wherein the density distribution gradually decreases outward.

17. The apparatus as claimed in claim 15, wherein the density distribution is generated using a random mode.

18. The apparatus as claimed in claim 11, wherein the blockages are minimum-sized blockages, and the electronic cells are non-overlapping with the blockages.

19. The apparatus as claimed in claim 11, wherein the blockages are transparent blockages, and the electronic cells overlap with the blockages.

20. The apparatus as claimed in claim 11, wherein an empty space ratio after the redistribution is substantially the same as that before the redistribution.

* * * * *